US006984887B2

(12) United States Patent
Umezu et al.

(10) Patent No.: US 6,984,887 B2

(45) Date of Patent: Jan. 10, 2006

(54) HEATSINK ARRANGEMENT FOR SEMICONDUCTOR DEVICE

(75) Inventors: Norio Umezu, Neyagawa (JP); Sadatoshi Hisamoto, Neyagawa (JP); Kazutaka Murayama, Neyagawa (JP)

(73) Assignee: ONKYO Corporation, Neyagawa (JP)

( * ) Notice: Subject to any disclaimer, the term of this patent is extended or adjusted under 35 U.S.C. 154(b) by 0 days.

(21) Appl. No.: 10/741,472

(22) Filed: Dec. 18, 2003

(65) Prior Publication Data

US 2004/0164405 A1 Aug. 26, 2004

(30) Foreign Application Priority Data

Feb. 24, 2003 (JP) ....................................... 2003-046449

(51) Int. Cl.
*H01L 23/10* (2006.01)

(52) U.S. Cl. ....................... 257/706; 257/675; 257/707; 257/712; 257/717; 257/720; 257/722; 257/724

(58) Field of Classification Search ................. 257/675, 257/706, 707, 712, 717, 720, 722, 724
See application file for complete search history.

(56) References Cited

U.S. PATENT DOCUMENTS

| | | | | | |
|---|---|---|---|---|---|
| 5,097,318 | A | * | 3/1992 | Tanaka et al. | 257/690 |
| 5,357,400 | A | * | 10/1994 | Takekawa | 361/704 |
| 5,404,273 | A | * | 4/1995 | Akagawa | 361/707 |
| 5,466,069 | A | * | 11/1995 | Agari | 384/49 |
| 6,011,299 | A | * | 1/2000 | Brench | 257/660 |
| 6,060,772 | A | * | 5/2000 | Sugawara et al. | 257/678 |
| 2001/0002051 | A1 | * | 5/2001 | Matsumoto | 257/177 |

FOREIGN PATENT DOCUMENTS

| | | |
|---|---|---|
| JP | 2-26256 | 2/1990 |
| JP | 4-40539 | 4/1992 |
| JP | 2853618 | 11/1998 |
| JP | 2000-260937 | 9/2000 |

* cited by examiner

*Primary Examiner*—Jasmine Clark
(74) *Attorney, Agent, or Firm*—Renner, Otto, Boisselle & Sklar, LLP

(57) ABSTRACT

A heatsink arrangement attached to a semiconductor device includes: a first heatsink placed in close contact with the semiconductor device; and second heatsink placed in close contact with the first heatsink, wherein the first heatsink and the second heatsink are connected to a power supply circuit for the semiconductor device via first connector and second connector, respectively. Thus, the present invention provides a heatsink arrangement for a semiconductor device used in an electric/electronic circuit that radiates less high-frequency noise even when a large current flows through the semiconductor device and that provides a high heat-radiating efficiency.

9 Claims, 2 Drawing Sheets

HEATSINK ARRANGEMENT FOR SEMICONDUCTOR DEVICE

BACKGROUND OF THE INVENTION

1. Field of the Invention

The present invention relates to a heatsink arrangement for a semiconductor device used in electric/electronic circuits.

2. Description of the Related Art

A semiconductor device used in an electric/electronic circuit generates heat due to power loss in the semiconductor device. Such a semiconductor device is typically provided with a heatsink for preventing the semiconductor device from breaking down due to heat generated therein. In a linear power amplifier for amplifying a small-power signal, e.g., an audio signal, into a large-power signal, a large amount of heat is generated due to power loss in the semiconductor device, and such a semiconductor device requires a heatsink with a large surface area and a large volume. A heatsink of a type that is placed in close contact with a semiconductor device is typically made of a metal such as aluminum, and radiates heat that has been generated in the semiconductor device.

An amplifier for amplifying a pulse-width-modulated small-power signal with a semiconductor switching device (typically a transistor or a MOSFET) generates less heat than a power amplifier as described above. However, with a high-output power amplifier, a large current flows through a semiconductor device performing the switching operation, thereby increasing the amount of heat generated due to power loss in the semiconductor device. Therefore, such an amplifier requires a heatsink.

Capacitive coupling occurs between a semiconductor device and a metal heatsink, which are placed in close contact with each other. As the semiconductor device performs the switching operation at a high frequency, high-frequency noise occurring due to a large current flows as a noise current into the heatsink via the capacitive coupling, and the high-frequency noise is radiated from the heatsink with a large surface area and a large volume functioning as an antenna. The radiated high-frequency noise should be reduced as it may adversely affect other electronic devices.

In the conventional art, a thermally-conductive spacer is provided between a semiconductor device and a heatsink to increase the distance therebetween and thus to reduce the capacitive coupling therebetween, in order to reduce high-frequency noise radiated from the heatsink. This however lowers the heat-radiating efficiency, and there is a certain limit to how much the distance between a semiconductor device and a heatsink can be increased by providing a spacer therebetween.

Another approach in the conventional art is to electrically connect a heatsink with a chassis of an electronic device so that a noise current flowing into the heatsink is passed to the grounded chassis, thereby reducing the radiation of high-frequency noise. According to still another approach in the conventional art, a dielectric material is provided between a semiconductor device (CPU) and a heatsink, while connecting the heatsink and the chassis of the electronic device with a conductive connection line. With the provision of the dielectric material, the semiconductor device and the heatsink are actively coupled together in capacitive coupling so as to flow the high-frequency noise current from the heatsink to the chassis (see pp. 1–3 and FIG. 1 of JP2853618B).

With such a heatsink arrangement, however, the high-frequency noise current flowing through the heatsink and the chassis increases as the current flowing through the semiconductor device increases. As a result, the flow of the noise current from the heatsink to the chassis via the connection line forms a mechanically large loop passing through the connection line and the chassis, thereby radiating substantial high-frequency noise. Thus, with the conventional heatsinks and heatsink arrangements, it is not possible to sufficiently reduce the high-frequency noise radiated by the heatsink.

SUMMARY OF THE INVENTION

It is therefore an object of the present invention to provide a heatsink arrangement for a semiconductor device used in an electric/electronic circuit that radiates less high-frequency noise even when a large current flows through the semiconductor device and that provides a high heat-radiating efficiency.

A heatsink arrangement for a semiconductor device of the present invention comprises: a first heatsink placed in close contact with the semiconductor device; and a second heatsink placed in close contact with the first heatsink, wherein the first heatsink and the second heatsink are connected to a power supply circuit for the semiconductor device via first connector and second connector, respectively.

In a preferred embodiment, an electric resistivity of a metal material of the first heatsink is smaller than that of a metal material of the second heatsink.

In a preferred embodiment, a thermal conductivity of a metal material of the first heatsink is larger than that of a metal material of the second heatsink.

In a preferred embodiment, a metal material of the first heatsink contains copper, and a metal material of the second heatsink contains aluminum or magnesium.

In a preferred embodiment, the first heatsink and the first connector are provided as an integral member.

In a preferred embodiment, the metal material of the first heatsink and the first connector contains copper; and the first connector is an extended and bent portion of the first heatsink.

In a preferred embodiment, the second connector comprises an attachment section provided in the second heatsink, via which the second heatsink is attached to a circuit board, and a copper foil pattern for electrically connecting the attachment section and the power supply circuit with each other.

In a preferred embodiment, the power supply circuit comprises a capacitor connected between a ground potential and a DC potential or between two DC potentials; and the capacitor is electrically connected to the first connector and the second connector and is provided in the vicinity of the semiconductor device.

In a preferred embodiment, an electrically-insulative and thermally-conductive intermediate member is provided between the semiconductor device and the first heatsink and/or between the first heatsink and the second heatsink.

In a preferred embodiment, the intermediate member is made of a material containing a silicon rubber, a resin or ceramics.

The function of the present invention will now be described.

The heatsink arrangement for a semiconductor device of the present invention comprises the first heatsink placed in close contact with the semiconductor device, and the second heatsink placed in close contact with the first heatsink.

Capacitive coupling occurs in the first heatsink in close contact with the semiconductor device. As a result, high-frequency noise generated by a large current in the semiconductor device causes a noise current to flow through the first heatsink and similarly causes a noise current to flow also through the second heatsink. The first heatsink and the second heatsink of the present invention are connected to a power supply circuit for the semiconductor device via first connector and second connector, respectively. The power supply circuit for the semiconductor device herein refers to a circuit for supplying a power for turning ON/OFF a semiconductor switching device such as a MOSFET in a switching amplifier. The power supply circuit has the ground potential and a DC potential, and comprises a capacitor connected therebetween for bypassing high-frequency noise to provide a reference point for the switching operation. The capacitor is placed in the vicinity of the semiconductor switching device. In some cases, the capacitor may be connected between two DC potentials of the power supply circuit. Therefore, according to the present invention, noise currents flowing through the first heatsink and the second heatsink can be bypassed by the capacitor of the power supply circuit for the semiconductor device via the first connector and the second connector, thereby minimizing the length of the noise current loop and thus reducing the radiation of high-frequency noise.

In the heatsink arrangement for a semiconductor device of the present invention, the distance between the semiconductor device and the second heatsink can be increased, whereby the noise current occurring in the second heatsink can be made smaller than that in the first heatsink, which is in close contact with the semiconductor device. In addition, it is preferred that the electric resistivity of the metal material of the first heatsink is smaller than that of the metal material of the second heatsink. Therefore, it is possible to further reduce the noise current occurring in the second heatsink.

Furthermore, it is preferred that the thermal conductivity of the metal material of the first heatsink is larger than that of the metal material of the second heatsink. Therefore, the first heatsink can desirably transfer the heat generated in the semiconductor device to the second heatsink, which has a larger surface area and a larger volume than the first heatsink for radiating heat away into the surrounding environment.

Typically, the metal material of the first heatsink of the present invention contains copper, and the metal material of the second heatsink contains aluminum or magnesium. As a result, it is possible to reduce the radiation of high-frequency noise from the second heatsink, which is more likely to radiate high-frequency noise because the second heatsink has a larger surface area and a larger volume than the first heatsink for radiating heat away into the surrounding environment.

Furthermore, it is preferred that the first heatsink and the first connector of the present invention are provided as an integral member. Typically, in a case where the metal material of the first heatsink of the present invention contains copper, the first connector may be an extended and bent portion of a copper-containing metal plate, which is connected to the power supply circuit for the semiconductor device. As the first heatsink and the first connector of the present invention are provided as an integral member, the electrical impedance is reduced, thereby making it easier for a noise current to flow through the first heatsink while making it more difficult for a noise current to flow through the second heatsink. Thus, the radiation of high-frequency noise from the second heatsink can be further reduced.

Furthermore, it is preferred that an electrically-insulative and thermally-conductive intermediate member is provided between the semiconductor device and the first heatsink and/or between the first heatsink and the second heatsink. In a case where the semiconductor device is a MOSFET in which the drain substrate is exposed, an intermediate member such as an electrically-insulative and thermally-conductive sheet is provided between the semiconductor device and a heatsink made of a metal so that heat generated in the semiconductor device can be desirably transferred to the first heatsink while maintaining the electrical insulation therebetween. In addition, the provision of the intermediate member as described above appropriately increases the distance between the semiconductor device and the first heatsink or between the first heatsink and the second heatsink, thereby reducing the coupling capacitance therebetween and thus further reducing the radiation of high-frequency noise.

DETAILED DESCRIPTION OF THE PREFERRED EMBODIMENTS

Heatsink arrangements for a semiconductor device according to preferred embodiments of the present invention will now be described. Note that the present invention is not limited to the following embodiments.

Figure 1:
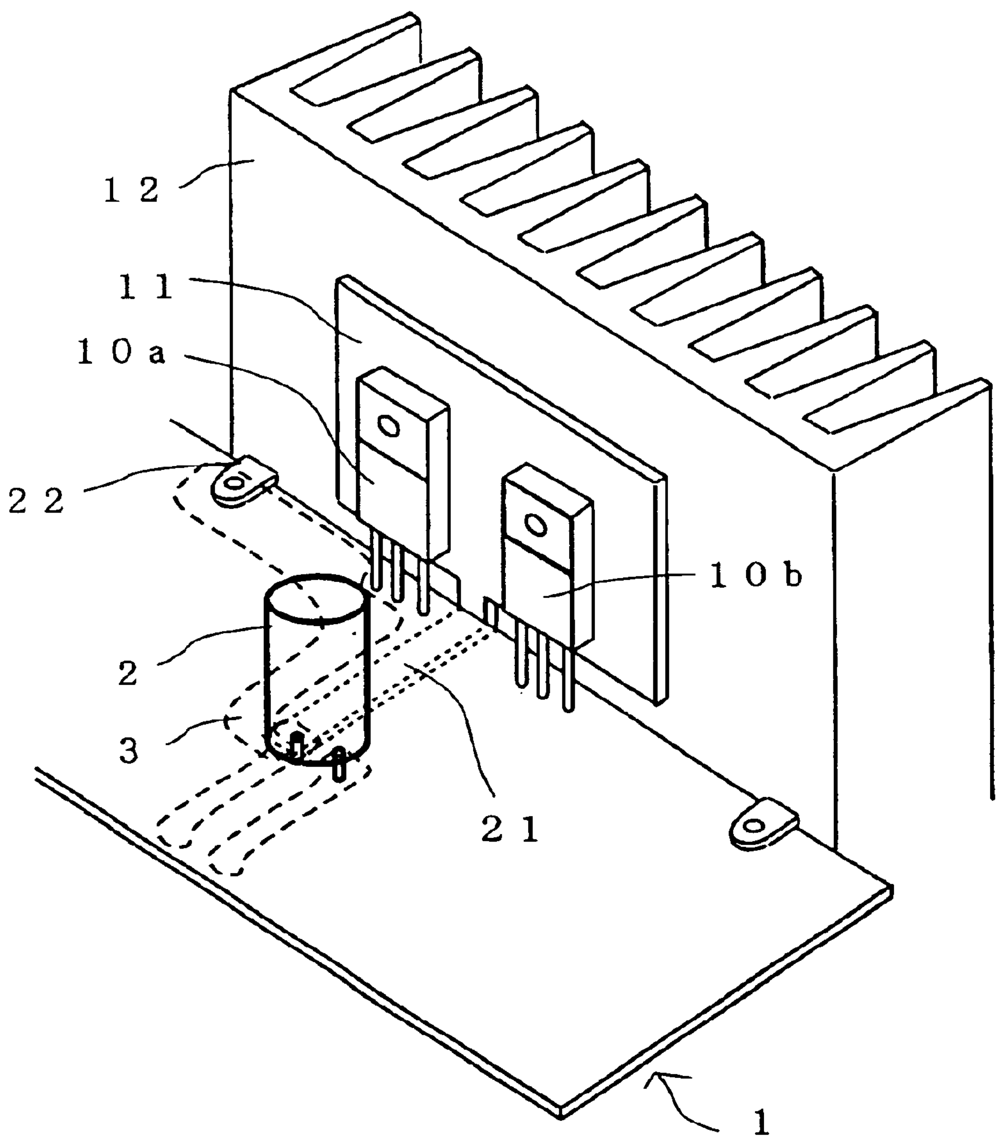
FIG. 1 is a perspective view illustrating a heatsink arrangement for a semiconductor device according to a preferred embodiment of the present invention.

FIG. 1 is a perspective view illustrating a heatsink arrangement for a semiconductor device according to a preferred embodiment of the present invention. Semiconductor devices 10*a* and 10*b* are attached to a circuit board 1 and are connected to an electric circuit. A capacitor 2 of the power supply circuit for the semiconductor devices 10*a* and 10*b* is provided on the circuit board 1 in the vicinity of the semiconductor devices 10*a* and 10*b*. A first heatsink 11 is placed in close contact with the semiconductor devices 10*a* and 10*b*, and a second heatsink 12 is placed in close contact with the first heatsink 11.

For the purpose of illustration, the circuit board 1 and the capacitor 2 are shown to be transparent, while using dotted lines to show a copper foil pattern 3 and first connector 21 for connecting the first heatsink 11 with the capacitor 2, which are provided on the reverse side of the circuit board 1. The semiconductor devices 10*a* and 10*b* are typically attached to the first heatsink 11 and the second heatsink 12 by screws (not shown) passed through holes in the semiconductor devices 10*a* and 10*b*.

Figure 2:
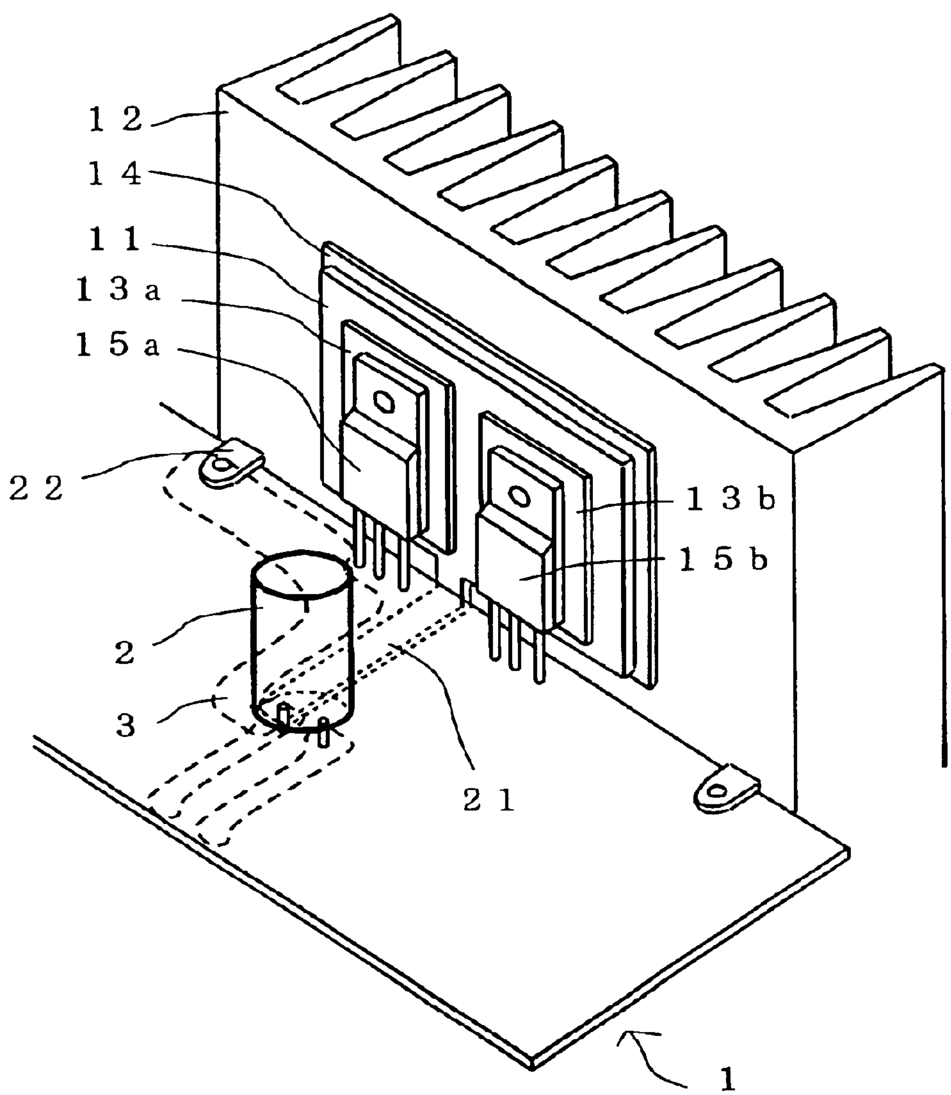
FIG. 2 is a perspective view illustrating a heatsink arrangement for a semiconductor device according to another preferred embodiment of the present invention.

The semiconductor devices 10*a* and 10*b* are typically semiconductor devices used in an electric/electronic circuit, such as switching devices used in power amplifiers, power supply circuits or motor driving circuits, or arithmetic devices used in electronic circuits. In the following description, it is assumed that the semiconductor devices 10*a* and 10*b* are MOSFETs in a switching amplifier. Note that the number of semiconductor devices used with the heatsink arrangement of the present invention is not limited to two, as shown in FIG. 1 or FIG. 2, but may alternatively be one or three or more.

Each of the MOSFETs 10*a* and 10*b* of FIG. 1 is encapsulated in a molded resin, and the drain substrate thereof and the electrodes are insulated from the first heatsink 11. The metal material of the first heatsink 11, which is in close contact with the MOSFETs 10*a* and 10*b*, may be the same as or different from that of the second heatsink 12. It is preferred that the electric resistivity of the metal material of the first heatsink 11 is smaller than that of the metal material of the second heatsink 12. Moreover, it is preferred that the thermal conductivity of the metal material of the first heatsink 11 is larger than that of the metal material of the second heatsink 12.

The term "electric resistivity" refers to the electrical impedance per unit volume, and a current flows through a substance more easily as the electric resistivity thereof is smaller. Moreover, the term "thermal conductivity" refers to the temperature change for an amount of heat moving inside a substance, and a larger thermal conductivity means better conduction of heat. The metal material of the first heatsink 11 or the second heatsink 12 is not limited to any particular metal material as long as the first heatsink 11 and the second heatsink 12 are in a relationship as described above in terms of electric resistivity and thermal conductivity. Typically, the metal material of the first heatsink 11 contains copper, and may be pure copper or a copper alloy. Moreover, the metal material of the second heatsink 12 typically contains aluminum or magnesium, and may be a pure metal or an alloy.

The first heatsink 11 in close contact with the MOSFETs 10*a* and 10*b* desirably transfers heat generated in the MOSFETs 10*a* and 10*b* to the second heatsink 12. Then, the heat is radiated from the second heatsink 12, which has a larger surface area and a larger volume than the first heatsink 11. As a result, even when a large current flows through the MOSFETs 10*a* and 10*b*, resulting in substantial power loss and substantial heat generation therein, it is possible to prevent the MOSFETs 10*a* and 10*b* from breaking down.

The first heatsink 11 and the second heatsink 12 are connected to the power supply circuit for the MOSFETs 10*a* and 10*b* via the first connector 21 and the second connector, respectively. In the present embodiment, the first heatsink 11 and the first connector 21 are provided as an integral member. For example, the first heatsink 11 and the first connector 21 are provided by shaping a copper-containing plate having a thickness of 0.1 to 5.0 mm (preferably 0.5 to 2.0 mm) into a square shape with an extended and bent portion that forms the first connector 21. More preferably, the copper-containing plate is a copper plate 1.0 mm thick, which is easily available and can easily be machined. The first connector 21 is connected to the capacitor 2 of the power supply circuit for the MOSFETs 10*a* and 10*b*, which is provided in the vicinity of the MOSFETs 10*a* and 10*b*. Moreover, the second heatsink 12 made of an aluminum-containing metal material, for example, includes a bent attachment section 22, via which the second heatsink 12 is attached to the circuit board 1, and the attachment section 22 is connected to the capacitor 2 of the power supply circuit for the MOSFETs 10*a* and 10*b* via the copper foil pattern 3. The attachment section 22 and the copper foil pattern 3 together form the second connector. The capacitor 2 of the power supply circuit for the MOSFETs 10*a* and 10*b* is connected between the ground potential and a DC potential of the power supply circuit for switching MOSFETs 10*a* and 10*b*, or between two DC potentials thereof, for bypassing high-frequency noise.

Capacitive coupling occurs between the MOSFETs 10*a* and 10*b* and the first and second heatsinks 11 and 12. Due to a large current that flows by the switching operation of the MOSFETs 10*a* and 10*b*, a high-frequency noise current occurs in the first heatsink 11 and a noise current similarly occurs also in the second heatsink 12, via the coupling capacitance. In the heatsink arrangement of the present invention, the noise currents flowing through the first heatsink 11 and the second heatsink 12 are bypassed by the capacitor 2 of the power supply circuit for the MOSFETs 10*a* and 10*b*, which is provided in the vicinity of the MOSFETs 10*a* and 10*b*, via the first connector 21 and the second connector, respectively, thereby minimizing the length of the noise current loop. Thus, it is possible to reduce the radiation of high-frequency noise from the first heatsink 11 and the second heatsink 12.

Furthermore, by providing the first heatsink 11 and the second heatsink 12 as in the embodiment of FIG. 1, the noise current occurring in the second heatsink 12, which is more distant from the MOSFETs 10*a* and 10*b*, can be made smaller than that in the first heatsink 11, which is in close contact with the MOSFETs 10*a* and 10*b*. Thus, it is possible to reduce the radiation of high-frequency noise from the second heatsink 12, which is more likely to radiate high-frequency noise because of the larger surface area and the larger volume.

In the embodiment of FIG. 1, the first connector 21, the second connector including the attachment section 22 and the copper foil pattern 3, and the power supply circuit for the MOSFETs 10*a* and 10*b* are connected together on the reverse side of the circuit board 1. The capacitor 2 of the power supply circuit for the MOSFETs 10*a* and 10*b* is connected between the ground potential and a DC potential or between two DC potentials, and bypasses the high-frequency noise to provide a reference point for the switching operation. Therefore, the first connector 21 and the second connector may be connected either to the ground potential side or to the DC potential side of the capacitor 2. In the embodiment of the present invention, the capacitor 2 is located in the vicinity of the MOSFETs 10*a* and 10*b*, and is connected to the first heatsink 11 and the second heatsink 12 via the first connector 21 and the second connector, respectively, thereby minimizing the length of the noise current loop and reducing the radiation of high-frequency noise.

FIG. 2 is a perspective view illustrating a heatsink arrangement for a semiconductor device according to another preferred embodiment of the present invention. Semiconductor devices (MOSFETs) 15*a* and 15*b* are different from the MOSFETs 10*a* and 10*b* of the embodiment of FIG. 1. For example, the semiconductor devices 15*a* and 15*b* are MOSFETs that are not entirely encapsulated in a molded resin, with the drain substrates being exposed. When the drain substrates of the MOSFETs 15*a* and 15*b* have different potentials, intermediate members 13*a* and 13*b* are provided between the MOSFETs 15*a* and 15*b* and the first heatsink 11 made of a metal for ensuring electrical insulation therebetween. For example, the intermediate members 13*a* and 13*b* are sheet members or spacer members made of a material containing a silicon rubber, a resin or ceramics. The intermediate members 13*a* and 13*b* are not limited to any particular material or structure as long as they have a thickness of 0.1 to 5.0 mm and are electrically-insulative and thermally-conductive. By maintaining the electrical insulation between the MOSFETs 15*a* and 15*b* and the first heatsink 11, it is possible to prevent the MOSFETs 15*a* and 15*b* from breaking down while desirably transferring the heat generated in the MOSFETs 15*a* and 15*b* to the first heatsink 11. In addition, the provision of the intermediate members 13*a* and 13*b* appropriately increases the distance between the MOSFETs 15*a* and 15*b* and the first heatsink 11, thereby reducing the coupling capacitance therebetween and thus reducing the noise current flowing through the first heatsink 11.

Furthermore, in the embodiment of FIG. 2, an electrically-insulative and thermally-conductive intermediate member 14 is provided between the first heatsink 11 and the second heatsink 12. The intermediate member 14 may be similar to the intermediate members 13*a* and 13*b* described above. The provision of the intermediate member 14 increases the distance between the first heatsink 11 and the second heatsink 12, thereby reducing the coupling capacitance therebetween and the noise current flowing through the second heatsink 12, thus further reducing the radiation of high-frequency noise. Needless to say, either the intermediate members 13*a* and 13*b* or the intermediate member 14 may be optional.

Heatsinks used in the present invention are not limited to those described in the embodiments above. The first heatsink 11 is not limited to a square-shaped plate with an extended and bent portion, as illustrated in FIG. 1 or FIG. 2. Moreover, the second heatsink 12 is not limited to those having heat-radiating fins as illustrated in FIG. 1 or FIG. 2. The second heatsink 12 may alternatively be formed by using a portion of the chassis of the electronic device. The shape of each heatsink used in the present invention may be determined appropriately according to the type of the electric/electronic circuit board and the semiconductor device used with the heatsink.

Moreover, the first connector 21 and the second connector for connecting the first heatsink 11 and the second heatsink 12, respectively, with the power supply circuit for the MOSFET are not limited to those described in the embodiments above, i.e., connector integral with a heatsink or connector including an attachment section and a copper foil pattern. The first connector 21 and the second connector may be, for example, an electrical wire having a small electric resistivity, a copper foil pattern having a large width, a electrically-conductive metal component, or the like, as long as the first heatsink 11 and the second heatsink 12 can be connected to the power supply circuit for the MOSFET with a low electrical impedance.

The heatsink arrangement for a semiconductor device of the present invention is capable of reducing the radiation of high-frequency noise even when a large current flows through the semiconductor device used in an electric/electronic circuit. Furthermore, the heatsink arrangement of the present invention has a high heat-radiating efficiency, and can prevent the semiconductor device from breaking down even when a large amount of heat is generated in the semiconductor device.

The heatsink arrangement of the present invention can suitably be used in an audio amplifier, for example.

What is claimed is:

1. A heatsink arrangement attached to a semiconductor device, comprising:

a first heatsink placed in close contact with the semiconductor device; and a second heatsink placed in close contact with the first heatsink, wherein the first heatsink and the second heatsink are connected to a power supply circuit for the semiconductor device via first connector and second connector, respectively, and an electric resistivity of a metal material of the first heatsink is smaller than that of a metal material of the second heatsink.

2. A heatsink arrangement according to claim 1, wherein a thermal conductivity of a metal material of the first heatsink is larger than that of a metal material of the second heatsink.

3. A heatsink arrangement according to claim 1, wherein a metal material of the first heatsink contains copper, and a metal material of the second heatsink contains aluminum or magnesium.

4. A heatsink arrangement according to claim 1, wherein the first heatsink and the first connector are provided as an integral member.

5. A heatsink arrangement according to claim 4, wherein:

the metal material of the first heatsink and the first connector contains copper; and the first connector is an extended and bent portion of the first heatsink.

6. A heatsink arrangement according to claim 1, wherein the second connector comprises an attachment section provided in the second heatsink, via which the second heatsink is attached to a circuit board, and a copper foil pattern for electrically connecting the attachment section and the power supply circuit with each other.

7. A heatsink arrangement according to claim 1, wherein:

the power supply circuit comprises a capacitor connected between a ground potential and a DC potential or between two DC potentials; and the capacitor is electrically connected to the first connector and the second connector and is provided in the vicinity of the semiconductor device.

8. A heatsink arrangement according to claim 1, wherein an electrically-insulative and thermally-conductive intermediate member is provided between the semiconductor device and the first heatsink and/or between the first heatsink and the second heatsink.

9. A heatsink arrangement according to claim 8, wherein the intermediate member is made of a material containing a silicon rubber, a resin or ceramics.

* * * * *